United States Patent [19]

Kozel et al.

[11] Patent Number: 4,934,944
[45] Date of Patent: Jun. 19, 1990

[54] CHIP CARRIER SOCKET WITH OPEN APERTURE

[75] Inventors: Charles A. Kozel, McHenry; John T. Scheitz, Barrington; Michael V. Stefaniu, Arlington Hts., all of Ill.

[73] Assignee: Methode Electronics, Inc., Rolling Meadows, Ill.

[21] Appl. No.: 268,014

[22] Filed: Nov. 7, 1988

[51] Int. Cl.⁵ .............................................. H01R 9/09
[52] U.S. Cl. ........................................ 439/68; 439/74
[58] Field of Search ................... 439/66, 67, 69, 70, 439/71, 74, 862, 525, 526

[56] References Cited

U.S. PATENT DOCUMENTS

| | | | |
|---|---|---|---|
| 3,877,064 | 4/1975 | Scheingold et al. | 439/68 |
| 4,050,755 | 9/1977 | Hasircoglu | 435/71 |
| 4,354,729 | 10/1982 | Grabbe et al. | 439/862 |
| 4,390,220 | 6/1983 | Benasutti | 439/71 |
| 4,494,807 | 1/1985 | Cosmo | 439/68 |

FOREIGN PATENT DOCUMENTS

| | | | |
|---|---|---|---|
| 2312915 | 12/1976 | France | 489/68 |
| 2162380 | 1/1986 | United Kingdom | 439/74 |
| 83/00585 | 2/1983 | World Int. Prop. O. | 439/71 |
| 84/01859 | 5/1984 | World Int. Prop. O. | 439/68 |

Primary Examiner—William Briggs
Attorney, Agent, or Firm—Allegretti & Witcoff, Ltd.

[57] ABSTRACT

A chip carrier socket comprises a frame which defines and surrounds a space for receiving a chip carrier. A plurality of elongated contacts are carried by the frame, the contacts each defining a first section which resides within the inner surface of the frame, and are positioned to conductivity engage peripheral contacts of a chip carrier carried in the space. The contacts also each define a second section positioned on one side of the chip carrier socket to engage conductive members of a circuit board when the socket is carried thereon. The second sections each define a contact end which projects inwardly. The chip carrier socket defines an open aperture within and through the frame adjacent the inner surface so that the inwardly projecting contact ends are visible while the socket is carried on a circuit board.

20 Claims, 1 Drawing Sheet

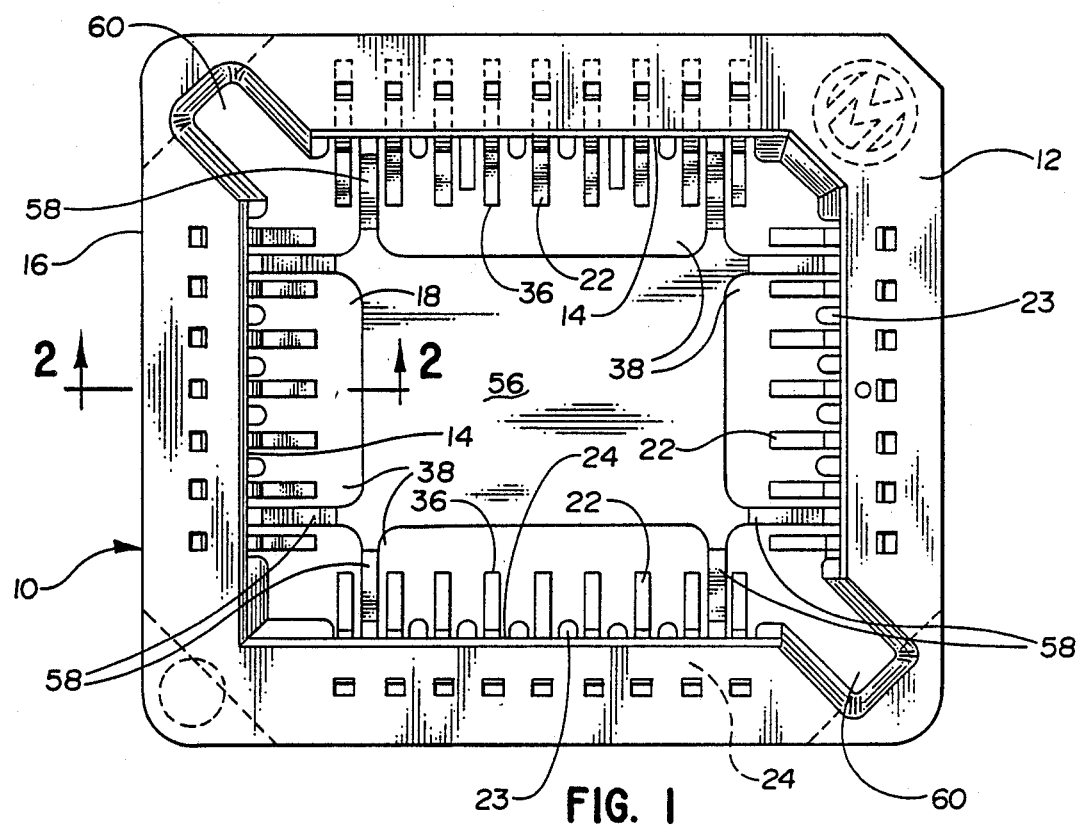
FIG. 1
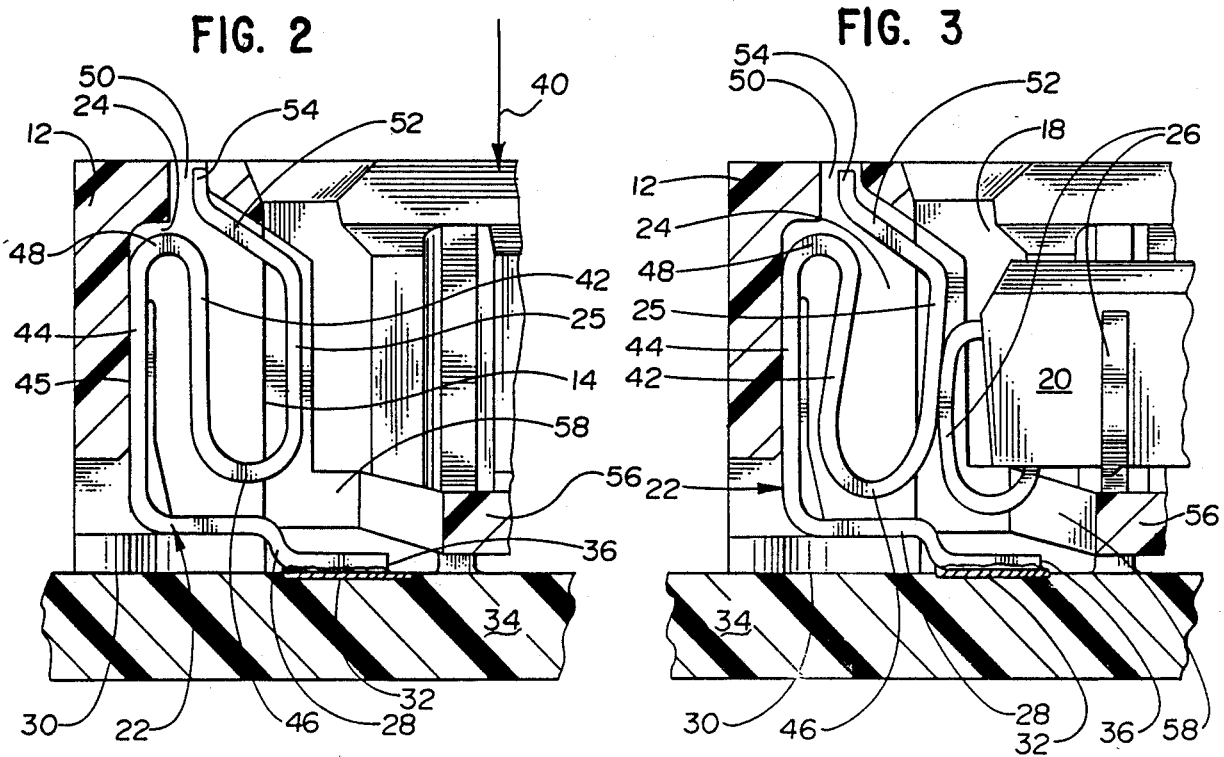
FIG. 2
FIG. 3

CHIP CARRIER SOCKET WITH OPEN APERTURE

BACKGROUND OF THE INVENTION

Integrated circuit chips may be carried in chip carriers such as plastic chip carriers with leads, these devices being commercially available. For mounting a chip carrier on a circuit board or the like, a chip carrier socket is used, with various designs of these sockets being commercially available.

One type of chip carrier socket which is currently available to the market is of the J-lead type. Such a chip carrier socket is a carrier structure defining a recess with a closed bottom for carrying the chip. A plurality of contact members are carried by the socket about the chip for entering into electrical contact with separate terminals on the periphery of the chip. The contact members of the socket then extend to one side thereof, which side is secured to a circuit board with the contacts being in electrical contact with conductors carried on the circuit board.

Chip carrier sockets may be mounted on a circuit board with through-board mounting with wave solder attachment. Alternatively, the sockets may be surface mounted by the use of a solder layer applied to the board and then heated so that the solder adheres the chip carrier socket to the board.

The J-lead type chip carrier socket has contacts which project inwardly toward their ends along the side of the socket which is attached to the circuit board. While such a configuration is space saving, it has the disadvantage that there is no way to inspect the connections of the contacts to the board or to repair faulty connections.

Another commercial design of chip carrier socket is the "gull-wing" type. This socket has similarities to the J-lead style, except that the contacts which connect the periphery of the chip to the circuit board have ends that extend outwardly rather than inwardly along the socket side which faces the board. This provides a socket system where the individual connections between the contacts and the board may be inspected and repaired if necessary. However, such a socket occupies more "real estate" on the board than the J-lead socket, and the outwardly projecting prongs of the terminals are subject to bending or other damage in handling.

While the gull-wing socket can be used with infrared soldering processes, the J-lead socket cannot, providing an additional disadvantage of that design.

In accordance with this invention, a new design of chip carrier socket is provided which has significant advantages over older designs. First, while the prongs of the contact members which adhere to the board can project inwardly for protection, they are still visible for inspection and repair of their seal to the board, and are usable with infrared soldering type processes, vapor phase bonding processes, and other surface mounting techniques.

The chip carrier socket of this invention may have a lower height than prior art designs, while the contact between the chip and the carrier socket may still be preloaded because of the novel design of terminal used herein. The chip carrier socket of this invention may use the same mounting pattern as an accompanying chip, and is fully compatible with all surface mount processing techniques. Also, it is susceptible for robotic assembly and adhesive bonding if that is desired, and may be used with optional polarizing pegs, and visual and mechanical polarization.

DESCRIPTION OF THE INVENTION

In this invention, a chip carrier socket is provided which comprises a frame having an inner and an outer surface. The chip carrier socket frame defines and surrounds a space for receiving a chip carrier. A plurality of elongated contacts are carried by the frame, the contacts each defining a first section which resides within the inner surface of the frame to conductively engage contacts of a chip carrier carried in this space. The contacts also each define a second section positioned on one side of the chip carrier socket to engage conductive members of a circuit board when the socket is carried thereon.

The second sections each define a contact end which projects inwardly relative to the frame. The socket defines an open aperture within and through the frame adjacent its inner surface. Thus, the inwardly projecting contact ends are visible while the chip carrier socket is carried on a circuit board, to permit the formation, inspection, and repair of their solder connections with the circuit board.

It is preferred for the chip carrier socket of this invention to carry a panel member or pad positioned in a central portion of the space, being thus substantially surrounded by the open aperture described above. The panel member is typically positioned adjacent the one side of the socket along which the second sections of the contacts is carried and from which the contact ends project inwardly. The panel member may be connected to the frame by thin struts or the like to provide the open aperture described above.

Preferably, the first sections of the contacts extend transversely of the frame. The contacts each preferably comprise a convoluted, elongated, linear conductive metal member which further defines a third section and a fourth section which each also extends transversely of the frame. The first, third, and fourth sections are separated from each other by turn-back loop sections to define a pair of convolutions which are typically in side-by-side relation. The inwardly projecting second section is connected to the fourth section at an end opposed to its connection with the turn-back section.

Each contact is typically positioned in a transverse slot defined in the frame, the slot having an inwardly facing opening. The fourth section of each contact is positioned against the outer wall of the slot, with the outer wall being opposed to the inward opening thereof. Thus, the convolutions of each contact function as a spring member to provide inward and outward resiliency to the first section, to facilitate good electrical contact with the chip. Because of the specific structure of the contacts used in this invention, it becomes possible for the frame of the chip carrier socket to define a reduced thickness parallel to its axis (i.e. its height) when compared with the prior art commercial chip carrier sockets of equal size. Specifically, the height of the chip carrier sockets of this invention may be no more than ¼ inch, typically about 0.2 inch.

The turn-back loop sections are typically loops defined in the contact on the order of about 180 degrees (although not necessarily exactly that amount), so that the first, third, and fourth sections of each contact define, with the turn-back loop sections, the pair of convolutions described above.

Preferably, each contact-carrying transverse slot in the frame defines a lateral branch slot. The first section of each contact is connected at its end opposed to its connected turn-back loop section to a fifth section that defines an end of the linear contact. The contact ends each occupy the respective lateral branch slot of the transverse slot in which the contact resides. This permits a spring preload to be placed on the first section of the contact, for better spring connection between the contacts and the chips carried in the socket.

DESCRIPTION OF THE DRAWINGS

In the drawings, FIG. 1 is a plan view of a chip carrier socket in accordance with this invention.

FIG. 2 is a sectional view taken along line 2—2 of FIG. 1.

FIG. 3 is a sectional view similar to that of FIG. 2, showing a chip carrier positioned within the chip carrier socket.

DESCRIPTION OF SPECIFIC EMBODIMENT

Referring to the drawings, a chip carrier socket 10 is disclosed, comprising a frame 12, defining an inner surface 14 and an outer surface 16, which surrounds a space 18 for receiving a chip carrier 20 within frame 12 as shown in FIG. 3. Frame 12 may be made of an appropriate molded plastic material.

Frame 12 also carries a plurality of elongated contacts 22 specifically made of convoluted, linear metal strips which reside in slots 24, which slots open inwardly to an open end extending through inner face 14 of frame 12. Contacts 22 may be of differing lengths, if desired, and are separated by inner plastic ribs 23 which extend inwardly from inner face 14 to assist in defining slots 24.

Each of contacts 22, carried in frame 12, defines a first section 25 (FIGS. 2 and 3) which resides within the inner surface of frame 12 and positioned to conductively engage contacts 26 of a chip carrier positioned within the space 18 within frame 12. Contacts 22 also each define a second section 28 positioned on one side 30 of the chip carrier socket to engage conductive members 32 of a circuit board 34 as shown in FIGS. 2 and 3. Second sections 28 each define a contact end 36 which projects inwardly with respect to frame 12, so that the contacts are generally protected by frame 12 and not as exposed to damage and bending as in the gullwing design.

In accordance with this invention, the chip carrier socket defines an open aperture 38 within the frame, extending completely through the frame adjacent inner surface 14. Accordingly, second sections 28 and ends 36 of the contacts are visible and accessible from the viewpoint of an observer symbolized by arrow 40 of FIG. 2, even after the chip carrier socket has been secured in position on a circuit board 34 as shown in both FIGS. 2 and 3. Thus, one may reach through chip carrier socket 12 from the position of arrow 40 to repair a broken or failed bond between any contact 22 and circuit board 34, through aperture 38.

Additionally, it can be seen that the first section 25 of each of contacts 22 extends transversely of frame 12. The convoluted, elongated, linear, conductive metal contacts further define a third section 42 and a fourth section 44, each of which also extend transversely of frame 12 as shown.

First, third and fourth sections 25, 42, 44, are separated from each other by turn-back loop sections 46, 48 of approximate U-shape, to define a pair of convolutions in the length of each contact 22 centered on sections 46 and 48 so that the five sections 25, 42, 44, 46 and 48 form a roughly S-shape configuration. It can be seen that second section 28 is carried on the outer end of fourth section 44, with fourth section 44 being positioned against the outer wall 45 of transverse slot 24 which is opposed to the inward opening thereof. Thus, the respective pair of convolutions in the contact structure function as a spring member to provide an inward and outward resiliency to first section 25.

Each transverse slot 24 defines a lateral branch slot 50. First section 25 is connected at its end opposed to the connected turn-back loop section 46 to a fifth section 52 which defines a contact end 54 opposite to contact end 36. Contact end 54 and adjacent contact portions occupy lateral branch slot 50, which permits the design to include a spring preload placed on first section 25 of the contact. Thus, as shown in FIG. 3, when a chip carrier is inserted, the resilience provided between the connection of contacts 25 and 26 can be of any desired predetermined force, depending upon the design in the preload provided. FIG. 3 also shows that end 54 of contact 22 can be pushed outwardly by the presence of chip carrier 20 to provide the desired spring load pressure on the contacts 26 of chip carrier 20.

Additionally in accordance with this invention, panel member 56 may be positioned in a central portion of space 18, surrounded by aperture 38. Panel member 56 may be integrally connected to frame 12 by molded, thin struts 58, to preferably position panel member 56, which is of greatly less height than the height of frame 12, at a position adjacent the side of socket 10 that is occupied by second sections 28 of contact 22. Panel member 56 may be used as a site for suction gripping by a robot arm to move and handle the chip carrier sockets of this invention in an automated manner. Also, it may be used as a site for gluing of the chip carrier socket to a circuit board 34, or other desired surface.

Because of the specific shape of the linear contact 22 used in this invention, it is possible to provide chip carrier sockets which are of significantly less height than the chip carrier sockets of prior art. This is so because a desired spring load may be provided to the contacts because of their particular shape and the presence of branch aperture 50, without the need for a contact which has a greater height, as necessary in other designs to provide the desired spring loading.

Frame 12 also defines opposed slots 60 for receiving an extraction tool for installing or removing chip carriers.

While the chip carrier socket is shown herein to be of rectangular shape, it may be of any desired shape, having contacts along all sides of the space within frame 12, or any individual side as may be desired.

The chip carrier socket of this invention exhibits significant advantages over the prior art chip carrier sockets, in that its contact portions which engage a circuit board extend inwardly rather than outwardly for greater protection thereof, but they are accessible after installation of the chip carrier socket on a board for testing of their bond integrity and repair thereof. Additionally, the chip carrier socket of this invention is susceptible to automated handling due to the presence of panel member 56, and may be surface mounted by a wide variety of conventional techniques onto boards. Also, it may be applied to boards using infrared processes. The exposed contact sections 28 insure full cleaning with maximum drainage, while the exclusive high pressure contact system eliminates the need for gold plating, while assuring a reliable, cost effective way to provide a surface mount socket for leaded chip carriers.

The above has been offered for illustrative purposes only, and is not intended to limit the scope of the invention of this application, which is as defined in the claims below.

That which is claimed is:

1. A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage a chip carrier carried in said space, said contacts also each defining a second section positioned on one side of said chip carrier socket to engage conductive members of a circuit board when said socket is carried thereon, the second sections each defining a contact end which projects inwardly from said frame, said socket defining an open aperture within and through said frame adjacent said inner surface, whereby said inwardly projecting contact ends are exposed in the upward perpendicular direction while the socket is carried on a circuit board.

2. The chip carrier socket of claim 1 in which a panel member is positioned in a horizontally central portion of said space.

3. The chip carrier socket of claim 2 in which said panel member is positioned adjacent said one side of the socket.

4. The chip carrier socket of claim 2 in which said panel member is connected to said frame by thin struts.

5. The chip carrier socket of claim 1 in which the first sections of said contacts extend transversely of said frame, said contacts each comprising a convoluted, elongated, linear, conductive metal member which further defines a third section and a fourth section which each extend transversely of said frame, said first, third, and fourth sections being separated from each other by turn-back loop sections to define a pair of convolutions, said second section being connected to the fourth section.

6. The chip carrier socket of claim 5 in which each contact is positioned in a transverse slot defined in said frame, said slot having an inwardly facing opening, said fourth section of the contact being positioned against the outer wall of said slot, said outer wall being opposed to the inward opening thereof, whereby said convolutions function as a spring member to provide inward and outward resiliency to said first section.

7. This chip carrier socket of claim 6 in which said pair of convolutions are in side-by-side relation.

8. The chip carrier socket of claim 7 in which said frame defines a height parallel to its axis of no more than ¼ inch.

9. The chip carrier socket of claim 6 in which each transverse slot defines a lateral branch slot, said first section being connected, at its end opposed to its connected turn-back loop section, to a fifth section that defines a contact end, said contact end occupying said lateral branch slot to permit a spring preload to be placed on the first section of said contact.

10. The chip carrier socket of claim 1 in which said frame defines opposed slots for receiving an extraction tool.

11. A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage contacts of a ship carrier carried in said space, said contacts each defining a second section positioned on one side of said chip carrier socket to engage conductive members of a circuit board when said socket is carried thereon, the second sections each defining a contact end which projects inwardly from said frame, said socket defining an open aperture within and through said frame adjacent said inner surface, whereby said inwardly projecting contact ends are exposed in the upward perpendicular direction while the socket is carried on a circuit board, said first section extending transversely of said frame, said contacts each comprising a convoluted, elongated, linear, conductive metal member which further defines a third section and a fourth section which each extends transversely of said frame, said first, third, and fourth sections being separated from each other by turnback loop sections to define a pair of convolutions, said second section being connected to the fourth section; and a panel member positioned in a central portion of said space defined by the frame.

12. The chip carrier socket of claim 11 in which said panel member is positioned adjacent the one side of the socket at which said second sections are positioned, said panel member being connected to said frame by thin struts.

13. The chip carrier socket of claim 12 in which each contact is positioned in a transverse slot defined in said frame, each slot having an inwardly facing opening, said fourth section of the contact being positioned against an outer wall of said slot, said outer wall being opposed to the inward opening thereof, whereby said convolutions function as a spring member to provide inward and outward resiliency to said first section.

14. The chip carrier socket of claim 13 in which said pair of convolutions are in side-by-side relation.

15. The chip carrier socket of claim 14 in which each transverse slot defines a lateral branch slot, said first section being connected at its end opposed to its connected turn-back loop section to a fifth section that defines a contact end, said contact end occupying said lateral branch slot to permit a spring preload to be placed on the first section of said contact.

16. The chip carrier socket of claim 15 in which said frame defines a height parallel to its axis of no more than one fourth inch.

17. The chip carrier socket of claim 16 in which said frame defines opposed slots for receiving an extraction tool.

18. A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage contacts of a chip carrier carried in said space, said contacts also each defining a second section positioned on one side of said chip carrier socket to engage conductive members of a circuit board when said socket is carried thereon, the second sections each defining a contact end which projects inwardly from said frame, said socket defining an open aperture within and through said frame adjacent said inner surfaces, whereby said inwardly projecting contact ends are exposed in the upward perpendicular direction while the socket is carried on a circuit board, and a panel member positioned in a central portion of said space.

19. The chip carrier socket of claim 18 in which said panel member is positioned adjacent said one side of the socket.

20. The chip carrier socket of claim 19 in which said panel member is connected to said frame by thin struts.

* * * * *

REEXAMINATION CERTIFICATE (2338th)
United States Patent [19]

Kozel et al.

[11] B1 4,934,944

[45] Certificate Issued Jul. 19, 1994

[54] CHIP CARRIER SOCKET WITH OPEN APERTURE

[75] Inventors: Charles A. Kozel, McHenry; John T. Scheitz, Barrington; Michael V. Stefaniu, Arlington Hts., all of Ill.

[73] Assignee: Methode Electronics, Inc., Rolling Meadows, Ill.

Reexamination Requests:
No. 90/003,106, Jun. 28, 1993
No. 90/002,864, Oct. 23, 1992

Reexamination Certificate for:
Patent No.: 4,934,944
Issued: Jun. 19, 1990
Appl. No.: 268,014
Filed: Nov. 7, 1988

[51] Int. Cl.⁵ ............................................. H01R 9/09
[52] U.S. Cl. ................................... 439/68; 439/74
[58] Field of Search ............................ 439/66–71, 439/74, 862, 525, 526

[56] References Cited

U.S. PATENT DOCUMENTS

| | | |
|---|---|---|
| 3,877,064 | 4/1975 | Scheingold et al. |
| 4,035,046 | 7/1977 | Kloth ............................ 339/17 |
| 4,050,755 | 9/1977 | Hasircoglu . |
| 4,089,575 | 5/1978 | Grabbe . |
| 4,354,729 | 10/1982 | Grabbe et al. |
| 4,390,220 | 6/1983 | Benasutti . |
| 4,461,524 | 7/1984 | McGhee . |
| 4,491,378 | 1/1985 | Crawford ...................... 339/75 |
| 4,494,807 | 1/1985 | Cosmo . |
| 4,511,201 | 4/1985 | Baker et al . |
| 4,761,140 | 8/1988 | Geib ................................ 439/71 |

FOREIGN PATENT DOCUMENTS

| | | |
|---|---|---|
| 2162380 | 1/1986 | England . |
| 2312915 | 12/1976 | France . |
| 60-102887 | 7/1985 | Japan . |
| WO 83/00585 | 2/1983 | PCT . |
| WO 83/01859 | 5/1983 | PCT . |

FOREIGN PATENT DOCUMENTS 60-102887  7/1985  Japan .

*Primary Examiner*—William Briggs

[57] ABSTRACT

A chip carrier socket comprises a frame which defines and surrounds a space for receiving a chip carrier. A plurality of elongated contacts are carried by the frame, the contacts each defining a first section which resides within the inner surface of the frame, and are positioned to conductivity engage peripheral contacts of a chip carrier carried in the space. The contacts also each define a second section positioned on one side of the chip carrier socket to engage conductive members of a circuit board when the socket is carried thereon. The second sections each define a contact end which projects inwardly. The chip carrier socket defines an open aperture within and through the frame adjacent the inner surface so that the inwardly projecting contact ends are visible while the socket is carried on a circuit board.

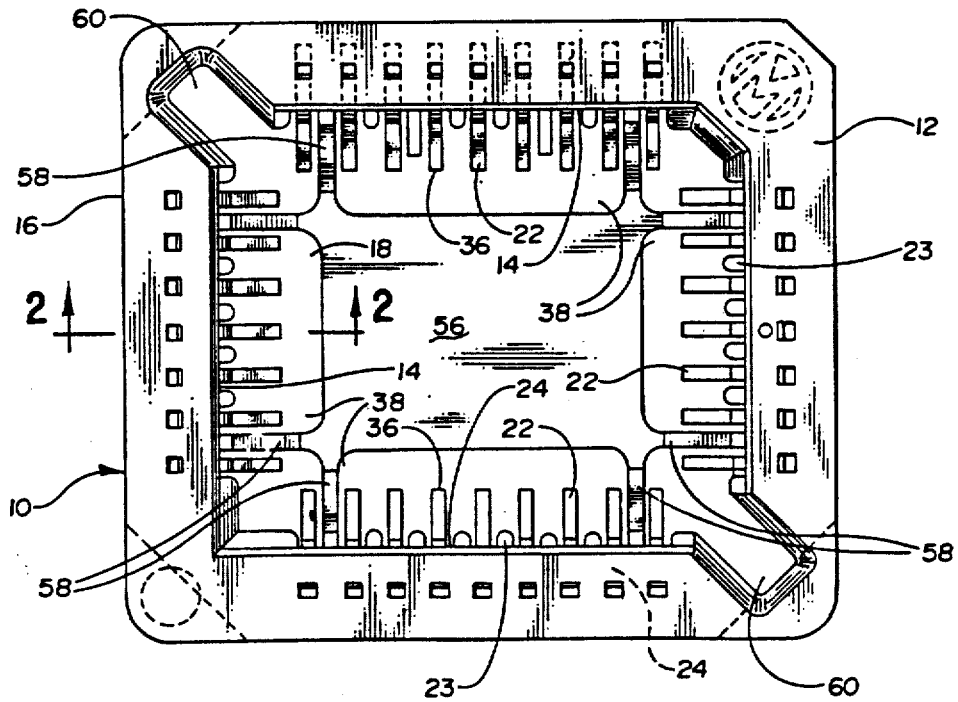

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 11-17 are confirmed.

Claim 1 is cancelled.

Claims 2, 5, 10 and 18 are determined to be patentable as amended.

Claims 3, 4, 6-9, 19 and 20, dependent on an amended claim, are determined to be patentable.

2. [The chip carrier socket of claim 1 in which] *A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage a chip carrier carried in said space, said contacts also each defining a second section positioned on one side of said chip carrier socket to engage conductive members of a circuit board when said socket is carried thereon, the second sections each defining a contact end which projects inwardly from said frame, said socket defining an open aperture within and through said frame adjacent said inner surface, whereby said inwardly projecting contact ends are exposed in the upward perpendicular direction while the socket is carried on a circuit board, and* a panel member [is] positioned in a horizontally central portion of said space.

5. A chip carrier socket which comprises a frame having an inner and outer surface which defines and surrounds a space for receiving a chip carrier, and a plurality of elongated contact carried by said frame, said contacts each defining a first section which resides within the inner surface of the frame and positioned to conductively engage a chip carrier carried in said space, said contacts also each defining a second section positioned on one side of said chip carrier socket to engage conductive members of a circuit board when said socket is carried thereon, the second section each defining a contact end which projects inwardly from said frame, said socket defining an open aperture within and through said frame adjacent said inner surface, whereby said inwardly projecting contact ends are exposed in the upward perpendicular direction while the socket is carried on a circuit board, said first sections of said contacts extending transversely of said frame, said contacts each comprising a convoluted, linear, conductive, metal member which further defines a third section and a fourth section which each extend transversely of said frame, said first, third, and fourth sections being separated from each other by turn-back loop sections to define a pair of convolutions, said second section being connected to said fourth section *and a panel member positioned in a central portion of said space.*

10. A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage a chip carrier carried in said space, said contacts also each defining a second section positioned on one side of said chip carrier socket to engage conductive members of a circuit board when said socket is carried thereon, the second sections each defining a contact end which projects inwardly from said frame, said socket defining an open aperture within and through said frame adjacent said inner surface, whereby said inwardly projecting contact ends are exposed in the upward perpendicular direction while the socket is carried on a circuit board, [and] said frame defining opposed slots for receiving an extraction tool, *and a panel member positioned in a central portion of said space.*

18. A chip carrier socket which comprises a frame having an inner and outer surface which defines and surrounds a space for receiving a chip carrier, and a plurality of elongated contacts carried by said frame, said contacts each defining a first section which resides within the inner surface of the frame and positioned to conductively engage contacts of a chip carrier carried in said space, said contacts also each defining a second section positioned on one [said] *side* of said chip carrier socket to engage conductive members of a circuit board when said socket is carried thereon, the second sections each defining a contact end which projects inwardly from said frame, said socket defining an open aperture within and through said frame adjacent said inner surfaces, whereby said inwardly projecting contact ends are exposed in the upward perpendicular direction while the socket is carried on a circuit board, and a panel member positioned in a central portion of said space.

* * * * *